(12) United States Patent
Yamada et al.

(10) Patent No.: US 7,352,044 B2
(45) Date of Patent: Apr. 1, 2008

(54) PHOTOELECTRIC TRANSDUCER, PHOTOELECTRIC TRANSDUCER APPARATUS, AND IRON SILICIDE FILM

(75) Inventors: Hiroshi Yamada, Tokyo (JP); Hisao Morooka, Tokyo (JP); Kazuo Nishi, Atsugi (JP)

(73) Assignees: TDK Corporation, Tokyo (JP); Semiconductor Energy Laboratory Co., Ltd., Kanagawa (JP)

( * ) Notice: Subject to any disclaimer, the term of this patent is extended or adjusted under 35 U.S.C. 154(b) by 0 days.

(21) Appl. No.: 10/542,147

(22) PCT Filed: Jan. 16, 2004

(86) PCT No.: PCT/JP2004/000322

§ 371 (c)(1),
(2), (4) Date: Sep. 6, 2005

(87) PCT Pub. No.: WO2004/064166

PCT Pub. Date: Jul. 29, 2004

(65) Prior Publication Data

US 2006/0049478 A1    Mar. 9, 2006

(30) Foreign Application Priority Data

Jan. 16, 2003    (JP) .............................. 2003-008717

(51) Int. Cl.
*H01L 31/00* (2006.01)
(52) U.S. Cl. .......................... 257/458; 257/53; 257/56; 257/E31.034; 257/E31.061; 257/E31.094; 136/249; 136/258; 136/261

(58) Field of Classification Search ................. 257/458, 257/464, 449, 454–456, 53, 54, 56, E31.034, 257/E31.061, E31.094; 136/258, 249, 255; 430/57

See application file for complete search history.

(56) References Cited

U.S. PATENT DOCUMENTS 4,539,054 A * 9/1985 Morimoto et al. .......... 148/403

(Continued)

FOREIGN PATENT DOCUMENTS

CN         1175095         3/1998

(Continued)

OTHER PUBLICATIONS

Patent Assignment Abstract of Title for the instant application.*

(Continued)

*Primary Examiner*—Minhloan Tran
*Assistant Examiner*—Benjamin Tzu-Hung Liu
(74) *Attorney, Agent, or Firm*—Oliff & Berridge, PLC

(57) ABSTRACT

A solar battery 10 comprises a metal electrode layer 12, a pin junction 100, and a transparent electrode layer 16 which are successively laminated on a substrate 11 such as a silicon substrate. The pin junction 100 comprises an n-layer 13, an i-layer 14, and a p-layer 15 which are laminated in succession. The i-layer 14 is formed by amorphous iron silicide ($Fe_xSi_y$:H) containing hydrogen atoms. In the i-layer 14, at least a part of the hydrogen atoms contained therein terminate dangling bonds of silicon atoms and/or iron atoms, so that a number of trap levels which may occur in an amorphous iron silicide film can be eliminated, whereby the i-layer 14 exhibits a characteristic as an intrinsic semiconductor layer.

15 Claims, 5 Drawing Sheets

U.S. PATENT DOCUMENTS

| | | | |
|---|---|---|---|
| 5,401,330 A * | 3/1995 | Saito et al. | 136/259 |
| 5,417,770 A * | 5/1995 | Saitoh et al. | 136/258 |
| 5,741,615 A * | 4/1998 | Saitoh et al. | 430/58.1 |
| 6,180,870 B1 | 1/2001 | Sano et al. | |

FOREIGN PATENT DOCUMENTS

| | | |
|---|---|---|
| EP | 0 827 213 A2 | 3/1998 |
| JP | A-59-075682 | 4/1984 |
| JP | A-02-260666 | 10/1990 |
| JP | A-04-210463 | 7/1992 |
| JP | A-07-166323 | 6/1995 |
| JP | A-09-082996 | 3/1997 |
| JP | A-2001-064099 | 3/2001 |
| JP | A-2002-047569 | 2/2002 |
| JP | A-2002-324765 | 11/2002 |
| JP | A-2003-188100 | 7/2003 |
| JP | A-2004-047601 | 2/2004 |
| WO | WO 98/18167 A1 | 4/1998 |

OTHER PUBLICATIONS

Tsuyoshi Yoshitake et al.; "Hydrogenation of semiconducting amorphous $FeSi_2$"; *Japan Atomic Energy Research Institute, JAERI-Conf. 2002-014*; Jan. 2003; pp. 12-13 (w/ translation).

* cited by examiner

PHOTOELECTRIC TRANSDUCER, PHOTOELECTRIC TRANSDUCER APPARATUS, AND IRON SILICIDE FILM

TECHNICAL FIELD

The present invention relates to a photoelectric transducer, a photoelectric transducer apparatus, and an iron silicide film.

BACKGROUND ART

Materials such as group IV semiconductors (crystalline and amorphous types), compound semiconductors (group III-V, group II-VI, group I-III-VI, transition metal silicides, etc.), and organic semiconductors (coloring matters, polymers, etc.) have been in use in photoelectric transducers employed in solar batteries (cells) and the like. Among these device materials, the compound semiconductors are advantageous in that they have a high optical absorption coefficient and a bandgap (bandgap energy: Eg) suitable for yielding a favorable photoelectric conversion efficiency.

Various structures such as pn junction, pin junction, and heterojunction have been known as modes of junctions of layers constituting a photoelectric transducer. The pin junction, in which a major part of photoelectrons and positive holes occur in a layer having an internal electric field (depletion layer), can generate a greater current than does the pn junction, and thus can eliminate the process of moving a carrier by diffusing it into a pn boundary which is seen in the pn junction. Therefore, the pin junction has recently been in wide use in so-called amorphous solar batteries.

Attention has further been focused on iron silicide which shows a semiconductor characteristic among transition metal silicides as an i-layer (intrinsic semiconductor layer) of a photoelectric transducer having a pin junction. Iron silicide is constituted by iron and silicon which are elements exhibiting a low environmental load and a long resource life. Also, iron silicide is a material exhibiting a small lattice mismatch with silicon substrates which are typically in use in semiconductor apparatus, while being widely excellent in optical, electric, magnetic, and thermoelectric characteristics.

Iron silicide expressed by $Fe_xSi_y$ in general exhibits a plurality of kinds of crystal phases mainly depending on its growth conditions and the composition ratio (x:y) between iron and silicon atoms. Of crystalline types of iron silicide, one having a semiconductor characteristic has been known to be $\beta$-$FeSi_2$, whereas various techniques have been proposed as methods of forming the same. Among them, methods disclosed in Patent Documents 1 to 4, for example, can be adopted for $\beta$-$FeSi_2$ employable in devices having a large area such as photoelectric transducers and methods of forming the same.

[Patent Document 1] Japanese Patent Application Laid-Open No. HEI 4-210463

[Patent Document 2] Japanese Patent Application Laid-Open No. HEI 7-166323

[Patent Document 3] Japanese Patent Application Laid-Open No. 2001-64099

[Patent Document 4] Japanese Patent Application Laid-Open No. 2002-47569

DISCLOSURE OF THE INVENTION

For forming $\beta$-$FeSi_2$ having a semiconductor characteristic, as can be seen from the descriptions of the above-mentioned prior publications, it is necessary for $\beta$-phase crystals to be grown sufficiently by high-temperature treatment at about 400 to 800° C. during or after performing its film-forming process. When the above-mentioned high-temperature treatment is performed at the time of manufacturing a photoelectric transducer or the like using $\beta$-$FeSi_2$ as its i-layer, the amount of heat fed into a substrate to be formed with the device may increase, thereby causing changes in shape. If a highly heat-resistant substrate is used in order to suppress the changes in shape, the thermal budget with respect to layers (p-layers, n-layers, electrode layers, functional layers, etc.) other than the i-layer constituting the device will increase, thereby causing a fear of adversely affecting the degeneration and characteristics of layers (films) and device characteristics, while enhancing restrictions on the process. The use of the highly heat-resistant substrate increases the material cost as well.

Photoelectric transducer apparatus such as solar batteries have recently been desired to further reduce their thickness and weight, thus yielding a tendency for thin members such as heat-resistant resin films to be employed as a substrate in place of silicon substrates, and their development has been in progress. However, such resin films must deform in terms of compositions in an environment at several hundred degrees, which makes it very hard for a photoelectric transducer using $\beta$-$FeSi_2$ as its i-layer necessitating high-temperature treatment at 400° C. or higher in the forming process as mentioned above to be disposed on such a resin film.

When trying to form $\beta$-$FeSi_2$ by heat treatment at 400° C. or lower by relaxing the temperature condition, silicide crystals do not grow sufficiently, thus causing a problem of generating iron silicide which is substantially amorphous or made of microcrystals. According to the inventors' findings, such amorphous or microcrystalline iron silicide tends to include many bonding defects, whereby a number of trap levels at different energy levels exist because of modes of these bonding defects.

Even when an i-layer containing many such bonding defects absorbs light, so that a photoelectron/positive hole pair is formed therein, the carrier transfer is obstructed by a plurality of trap levels. In this case, semiconductor characteristics required for the i-layer are not exhibited, so that a photoelectric transducer is not established.

In view of such circumstances, it is an object of the present invention to provide an iron silicide film which can easily be formed by low-temperature treatment (process) and can fully exhibit semiconductor characteristics, a photoelectric transducer having excellent device characteristics, and a photoelectric transducer apparatus equipped with the transducer.

For overcoming the problems mentioned above, the photoelectric transducer in accordance with the present invention comprises a first pin junction part including a first p-layer; a first n-layer disposed so as to oppose the first p-layer; and a first i-layer, disposed between the first p-layer and first n-layer, containing an iron atom, a silicon atom bonded to the iron atom, and a hydrogen atom.

In thus configured photoelectric transducer, the i-layer in the first pin junction part is constructed by a bonding structure of iron and silicon atoms, i.e., iron silicide. Therefore, even if this iron silicide does not have crystallinity and may conventionally include bonding defects, such bonding defects can sufficiently be restrained from occurring when the i-layer further contains a hydrogen atom. Specifically, it is presumed that the bonding defects are mainly caused by dangling bonds of silicon atoms and/or iron atoms, and the hydrogen atom is bonded to such a dangling bond as if the later is terminated. The inventors formed an i-layer made of hydrogen-containing iron silicide ($Fe_xSi_y$:H) and evaluated its I-V characteristic, whereby the layer was found to have a clear bandgap and was seen to function as an intrinsic semiconductor.

Preferably, the first i-layer is formed by at least partly bonding the hydrogen atom to the silicon atom or iron atom. One containing a fluorine atom instead of the hydrogen atom is also presumed to be useful from the viewpoint of terminating a dangling bond of the silicon atom or iron atom.

According to studies conducted by the inventors, the hydrogen content suitable for exhibiting a sufficient semiconductor characteristic tends to be greater than the required amount of hydrogen estimated from the amount of in-film defects in the i-layer evaluated separately as the case may be, thus leaving many unclear points in details of microstructures such as whether a major part of hydrogen atoms contained in the i-layer are highly selectively combined with dangling bonds or not. However, a main reason why even a film material which may latently generate bonding defects exhibits a semiconductor characteristic is presumed to lie in that the above-mentioned trap levels due to bonding defects are eliminated by the terminating action of hydrogen atoms. The amount of in-film defects can be measured and evaluated by ESR. In this case, the amount of in-film defects can quantitatively be evaluated by using a calibration curve obtained by ESR measurement of an amorphous silicon film whose amount of defects has been quantitatively determined beforehand.

It is also unclear which of the bond between silicon and hydrogen atoms or the bond between iron and hydrogen atoms is predominant. However, the bond between silicon and hydrogen atoms is assumed to be predominant over the bond between iron and hydrogen atoms because of the following reasons (1) and (2). Reason (1): The bond between silicon and hydrogen atoms seems to be greater than the bond between iron and hydrogen atoms. Reason (2): The dangling bonds of silicon atoms which seem to be more contributory to forming a basic skeleton having a grid-like network are presumed to be predominant. The operations are not limited thereto, however.

Preferably, the first i-layer is mainly amorphous. Here, "mainly amorphous" refers to one substantially free of monocrystallinity and polycrystallinity, and encompasses amorphous one, microcrystalline one, and one in which both of them are mixed together. When the first i-layer is thus mainly amorphous, the high-temperature treatment (process) at 400° C. or higher required in conventional $\beta$-$FeSi_2$ having a crystallinity (monocrystallinity or polycrystallinity) is unnecessary at the time of manufacture.

Preferably, the first i-layer has a hydrogen atom content of 1 to 25 atom %. The bonding defects included in amorphous iron silicide are usually estimated at 1 atom % or less, mostly 0.1 atom % or less, in terms of atoms. According to the inventors' findings, bonding defects which may occur in an i-layer are harder to eliminate sufficiently if the hydrogen atom content in the i-layer is less than 1 atom %. When the content exceeds 25 atom %, on the other hand, there is a fear of the transducer remarkably lowering its photoelectric conversion efficiency.

Preferably, the above-mentioned first pin junction part further comprises a second i-layer disposed between the first p-layer and first n-layer and constituted by a mainly amorphous silicon film. Thus configured photoelectric transducer is a so-called hybrid device, i.e., one in which the intrinsic semiconductor layer in the first pin junction part is constituted by a composite layer including a first i-layer made of hydrogen-containing iron silicide ($Fe_xSi_y$:H) and a second i-layer made of amorphous silicon and/or microcrystalline silicon. The second i-layer exhibits a higher absorption coefficient for high-energy photons (short-wavelength photons) than does the first i-layer, so that the transducer as a whole can expand the absorption wavelength region, thereby increasing the output current.

It will also be useful if the transducer further comprises a second pin junction part, disposed in series with the first pin junction part, including a second p-layer, a second n-layer disposed so as to oppose the second p-layer, and a third i-layer disposed between the second p-layer and second n-layer and made of an amorphous silicon film. This constructs a tandem device in which the first and second pin junction parts are arranged in series, whereas the wavelength absorption characteristics of their respective first and third i-layers differ from each other as mentioned above, whereby the output voltage of the device increases.

The photoelectric transducer apparatus in accordance with the present invention comprises a substrate; a first electrode layer disposed on one side of the substrate; a second electrode layer disposed so as to oppose the first electrode layer; and a first pin junction part including a first n-layer formed on the first electrode layer, a first p-layer formed on one side of the second electrode layer so as to oppose the first n-layer, and a first i-layer, disposed between the first p-layer and first n-layer, containing an iron atom, a silicon atom bonded to the iron atom, and a hydrogen atom or fluorine atom. The first p-layer may be disposed on one side of the first electrode layer, whereas the first n-layer may be formed on one side of the second electrode layer.

The iron silicide film in accordance with the present invention constructs an i-layer in a pin junction, and contains an iron atom, a silicon atom bonded to the iron atom, and a hydrogen atom or fluorine atom, while being mainly amorphous.

The iron silicide film in accordance with the present invention, the photoelectric transducer using the same as an i-layer of a pin junction, and the photoelectric transducer apparatus equipped with the transducer can easily be manufactured by low-temperature treatment, so that adverse thermal influences on the substrate and the individual layers constituting the transducer can be eliminated, while excellent semiconductor characteristics can be exhibited, whereby a high conversion efficiency can be achieved, and device characteristics can be improved.

BEST MODES FOR CARRYING OUT THE INVENTION

Figure 1:
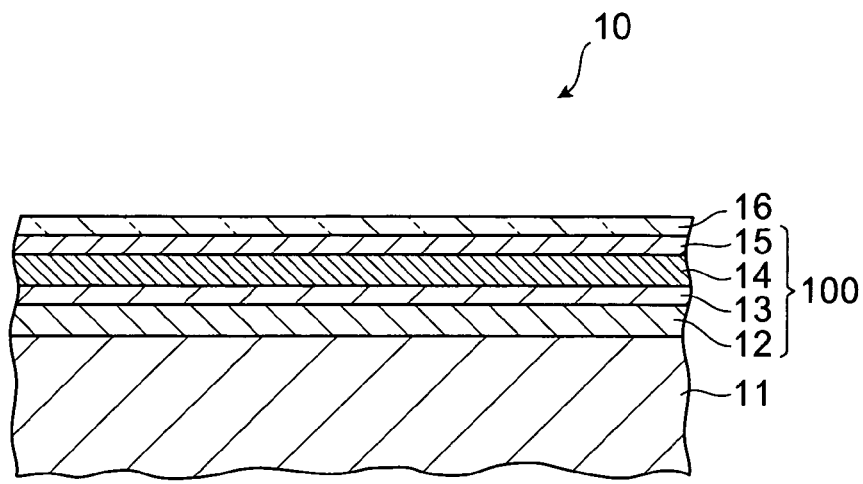
FIG. 1 is a schematic view showing a cross-sectional structure of the solar battery in accordance with a first embodiment.

In the following, embodiments of the present invention will be explained in detail with reference to the drawings. Constituents identical to each other will be referred to with numerals identical to each other without repeating their overlapping descriptions. Positional relationships such as upper, lower, left, and right are based on those in the drawings. The embodiments show examples in which the present invention is employed in solar batteries. The solar batteries in accordance with the embodiments include the photoelectric transducer and iron silicide film in accordance with embodiments of the present invention as a matter of course.

First Embodiment

FIG. 1 is a schematic view showing a cross-sectional structure of the solar battery in accordance with a first embodiment. This solar battery 10 (photoelectric transducer) is one in which a metal electrode layer 12, a pin junction 100 (first pin junction part or photoelectric transducer), and a transparent electrode layer 16 are successively laminated on a substrate 11. Usable as the substrate 11 are silicon substrates, films made of polyamide resin or polyimide resin, etc.

Though not restricted in particular, the metal electrode layer 12 is preferably constituted by a material which exhibits a predetermined high conductivity and is hard to be damaged by a high-temperature atmosphere of about 400° C., while its reactivity with individual layers (which will be explained later) constituting the pin junction 100 is as low as possible. Preferred examples of such a material include rare metals such as Au, Pt, Pd, Ir, and Ag; rare metal alloys such as Au—Pd, Au—Pt, Ag—Pd, and Ag—Pt; and alloys such as Ag—Pd—Cu mainly composed of rare metals while being doped with base metals. The metal electrode layer 12 usually has a thickness of about 0.1 to 1 µm, for example, and can be formed by using a known method such as a PVD method, e.g., sputtering.

The transparent electrode layer 16 is positioned on the light-receiving surface side of the solar battery 10, and is constituted by a transparent conductive material. As such a transparent conductive material, conductive oxide materials such as $In_2O_3$, $SnO_2$, ITO, and ZnO—Al, for example, can be used. The transparent electrode layer 16 usually has a thickness of about 0.05 to 1 µm, for example, and can be formed by using a known method such as a PVD method, e.g., sputtering.

The pin junction 100 is one in which an n-layer 13, an i-layer 14 (iron silicide film), and a p-layer 15 are successively laminated on the metal electrode layer 12. An example of the n-layer 13 (n-type semiconductor layer) is an n-type silicon layer, whereas the n-type silicon layer is not restricted in particular as long as it is used in pin junctions for solar batteries in general, and may be a layer including a crystal phase or an amorphous layer. When a silicon layer is used, examples of impurities (dopants) for making it n-type include atoms of group V elements (phosphorus, arsenic, and antimony). The n-layer 13 usually has a thickness of about 10 to 500 nm, for example, and can be formed by using a known method such as a CVD method, e.g., plasma CVD or thermal CVD.

The i-layer 14 (i-type semiconductor layer) is one made of iron silicide containing hydrogen atoms ($Fe_xSi_y$:H) while being mainly amorphous (though it may be constituted by a microcrystal phase or include a microcrystal phase as mentioned above), i.e., one substantially free of monocrystal and polycrystal components. The hydrogen atom content in the i-layer 14 is preferably 1 to 25 atom %, more preferably 5 to 20 atom %. It will usually be preferred if the thickness of the i-layer 14 is about 0.1 to 10 µm, for example.

The "hydrogen atom content" in the i-layer 14 can be determined from the amount of hydrogen ($H_2$:M/S=2) degassed from within the film measured by thermal desorption spectroscopy (TDS).

The following is an example of methods for forming such an i-layer 14. First, a substrate 11 formed with a metal electrode layer 12 and an n-layer 13 is placed within an appropriate chamber, whereas a silicon-atom-containing gas such as monosilane or disilane gas and a hydrogen ($H_2$) gas are fed as material gases into a chamber in an atmosphere under reduced pressure. A high-frequency power is applied within the chamber, so as to form plasmas of the material gases, whereas an iron vapor generated by heating an iron target, for example, is further supplied into the plasmas. Here, the substrate 11 is heated to a temperature of at least 100° C. but less than 400° C., so as to deposit $Fe_xSi_y$:H onto the n-layer 13, thereby yielding an i-layer 14.

Thus obtained i-layer 14 is seen to have an optical bandgap of Eg(opt)≈0.85 eV, and exhibit a characteristic of transmitting therethrough light having a wavelength longer than a light wavelength (about 1500 nm) corresponding to the Eg while showing an I-V characteristic inherent in semiconductors. By analogy with the fact the above-mentioned Eg is substantially equal to the Eg of $\beta$-$FeSi_2$, the composition ratio between iron and silicon atoms in the i-layer 14 is assumed to be a value near x:y≈1:2.

However, the composition ratio between iron and silicon atoms in the i-layer 14 estimated from the result of determining a material composition ratio by which the i-layer 14 can exhibit a semiconductor characteristic, while the ratio between material supply amounts, i.e., the amount of supply of the above-mentioned silicon-containing-gas and the amount of supply of iron vapor, is changed variously, is seen to fluctuate considerably about the ratio of x:y≈1:2 (on the order of 1:1.7 to 1:3.5 as the case may be). Therefore, it is still unclear in detail whether the i-layer 14 has a stoichiometry equivalent to that of crystalline $\beta$-$FeSi_2$ or not, whereas the possibility of the i-layer 14 exhibiting a semiconductor characteristic by a mechanism different from that of conventional $\beta$-$FeSi_2$ cannot be denied.

An example of the p-layer 15 (p-type semiconductor layer) is a p-type silicon layer. The p-type silicon layer is not restricted in particular as long as it is used in pin junctions for solar batteries in general, and may be a layer including a crystal phase or an amorphous layer. When a silicon layer is used, examples of impurities (dopants) for making it p-type include atoms of group III elements (boron, aluminum, gallium, etc.). The p-layer 15 usually has a thickness of about 10 to 100 nm, for example, and can be formed by using a known method such as a CVD method, e.g., plasma CVD or thermal CVD.

Since the i-layer 14 is formed from mainly amorphous iron silicide containing hydrogen atoms ($Fe_xSi_y$:H) and exhibits a semiconductor characteristic, the pin junction 100 functions as an excellent photoelectric transducer in thus configured solar battery 10. Namely, among photons incident on the pin junction 100 by way of the transparent electrode layer 16, light having an energy wavelength greater than the bandgap energy Eg of the i-layer 14 is photoelectrically converted within the i-layer 14 so as to form photoelectron/positive hole pairs, whereby the battery can yield a high photoelectric conversion efficiency.

This is presumed to be because of the fact that at least a part of hydrogen atoms contained therein combine with dangling bonds of silicon atoms and/or iron atoms, i.e., dangling bonds which may occur in amorphous iron silicide are terminated by hydrogen atoms, so as to eliminate bonding defects in the i-layer 14. It seems that a plurality of trap levels are prevented from appearing within the i-layer 14 because of such bonding defects, whereby the carrier transfer in the carrier moving process within the i-layer 14 is performed smoothly.

Since the i-layer 14 is formed from such mainly amorphous $Fe_xSi_y$:H, the high-temperature treatment at about 400 to 800° C. required when forming conventional crystalline $\beta$-$FeSi_2$ is unnecessary in the forming process. This can remarkably reduce the amount of heat fed into the substrate 11 and restrain the substrate 11 from being denatured and deformed. The reduction in heat input amount lowers the thermal budget, whereby thermal influences on the metal electrode layer 12 and n-layer 13 can be eliminated.

For the substrate 11, it is not necessary to use highly heat-resistant ones which are relatively expensive, whereby the solar battery 10 can be made more economically. Since low-temperature treatment (process) can be employed, a heat-resistant resin film can be used as the substrate 11, whereby the solar battery 10 can further reduce its layer thickness and weight. When the hydrogen atom content in the i-layer 14 is at least 1 atom %, the termination of dangling bonds ("embedding" of bonding defects in terms of conception) can fully be promoted. When the hydrogen atom content is 20 atom % or less in the i-layer 14, the photoelectric conversion efficiency in the solar battery 10 can fully be suppressed.

Second Embodiment

Figure 2:
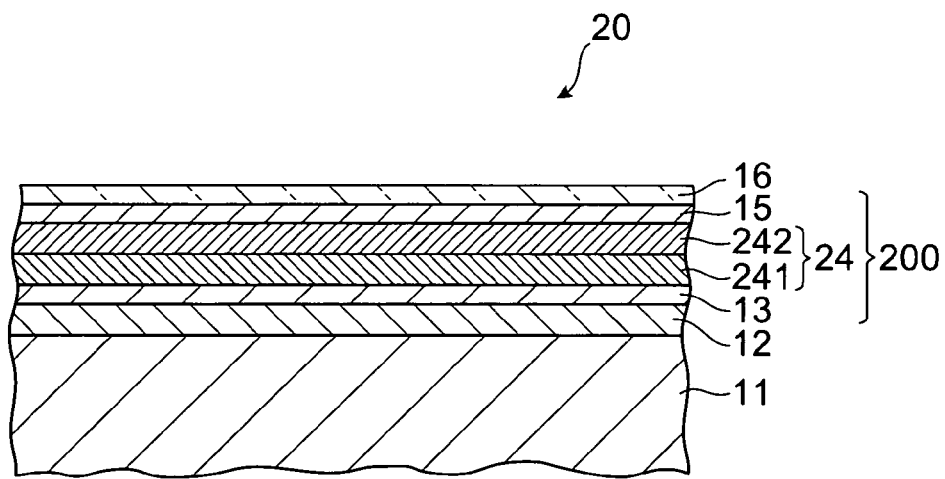
FIG. 2 is a schematic view showing a cross-sectional structure of the solar battery in accordance with a second embodiment.

FIG. 2 is a schematic view showing a cross-sectional structure of the solar battery in accordance with a second embodiment. This solar battery 20 (photoelectric transducer) has the same configuration as with the solar battery 10 shown in FIG. 1 except that it is equipped with a pin junction 200 (first pin junction part) in place of the pin junction 100. The pin junction 200 has the same configuration as with the pin junction 100 of the solar battery 10 except that it includes a composite i-layer 24 instead of the i-layer 14.

The composite i-layer 24 is constituted by an i-layer 241 (first i-layer or iron silicide film) made of amorphous $Fe_xSi_y$:H formed on the p-layer 13, and an i-layer 242 (second i-layer) made of amorphous silicon laminated on the first i-layer. Namely, the solar battery 20 is a hybrid photoelectric transducer apparatus in which a plurality of different kinds of i-layers are laminated. The i-layer 241 has the same structure as that of the i-layer 14 mentioned above, and can be formed as with the i-layer 14. The i-layer 242 usually has a thickness of about 100 to 500 nm, for example, and can be formed by using a known method such as a CVD method, e.g., plasma CVD or thermal CVD.

In thus configured solar battery 20, the i-layer 241 exhibits a higher absorption coefficient for low-energy photons (long-wavelength photons) than does the i-layer 242, so that, among photons incident on the i-layer 242, those having relatively short wavelengths are photoelectrically converted with a high efficiency, whereas those having relatively long wavelength are transmitted through the i-layer 242, so as to be made incident on the i-layer 241. The i-layer 241 photoelectrically converts and absorbs the photons having relatively long wavelengths. Thus, the solar battery 20 as a whole can expand its absorption wavelength region, and thus can attain a greater current at a voltage equivalent to that of the solar battery 10. The other operations and effects achieved by the solar battery 20 are the same as those of the solar battery 10 and will not be mentioned here in order to avoid overlapping descriptions.

Third Embodiment

Figure 3:
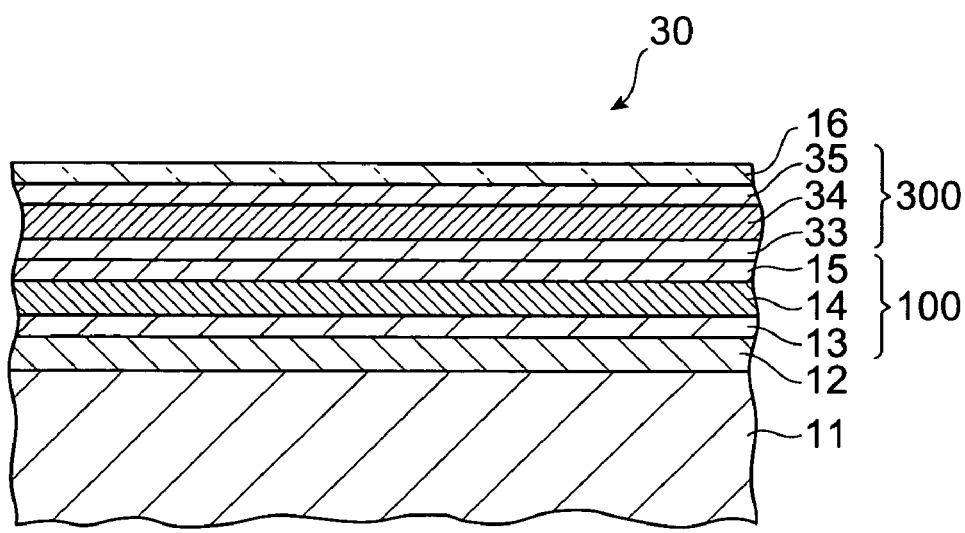
FIG. 3 is a schematic view showing a cross-sectional structure of the solar battery in accordance with a third embodiment.

FIG. 3 is a schematic view showing a cross-sectional structure of the solar battery in accordance with a third embodiment. This solar battery 30 (photoelectric transducer apparatus) has the same configuration as with the solar battery 10 shown in FIG. 1 except that it further comprises a pin junction 300 (second pin junction part) between the pin junction 100 and the transparent electrode layer 16. The pin junction 300 comprises an n-layer 33 (second n-layer) formed like the n-layer 13, a p-layer 35 (second p-layer) formed like the p-layer 15, and an i-layer 34 (third i-layer) formed therebetween from amorphous silicon as with the i-layer 242.

Thus configured solar battery 30 is a tandem photoelectric transducer apparatus in which the pin junctions 100, 300 are arranged in series. Of photons incident on the i-layer 34 of the pin junction 300 by way of the transparent electrode layer 16, those having relatively short wavelengths are photoelectrically converted with a high efficiency, whereas those having relatively long wavelengths are transmitted through the i-layer 34 so as to be made incident on the i-layer 14 of the pin junction 100. The i-layer 14 photoelectrically converts and absorbs the photons having relatively long wavelengths. Hence, the solar battery 30 is advantageous in that its output voltage can be made greater than that of the solar battery 10. The other operations and effects achieved by the solar battery 30 are the same as those of the solar battery 10 and will not be mentioned here in order to avoid overlapping descriptions.

Without being restricted to the above-mentioned embodiments, the present invention can be modified in various ways within the scope not deviating from the gist thereof. For example, the p- and n-layers may be replaced with each other in the pin junctions 100, 200, 300.

Though the metal electrode layer 12 and transparent electrode layer 16 may be replaced with each other, the i-layer 242 in the solar battery 20 is desired to be disposed on the upstream side of the i-layer 241 in the light incidence direction. It will be desirable if the pin junction 300 in the solar battery 30 is disposed on the upstream side of the pin junction 100 in the light incidence direction. In the following, details of the present invention will be explained more specifically with reference to examples, which will not restrict the present invention.

EXAMPLE 1

An Si wafer having a main surface with a surface orientation of (100) was accommodated as a substrate into an upper part of a chamber and fixed to a support table in a facedown fashion, whereas the chamber was evacuated from its upper part (a chamber upper wall opposing the rear side of the Si wafer) such that the pressure within the chamber became 1.33 Pa. While keeping this pressure, a monosilane (SiH$_4$) gas and a hydrogen (H$_2$) gas were supplied into the chamber from the lower part thereof each at a flow rate of 50 sccm, while a high-frequency power of 50 W was applied to a copper coil of an L coupling placed about the chamber, so as to form plasmas of a mixed gas of monosilane and hydrogen gases within the chamber.

Simultaneously with the forming of plasmas, an iron ingot placed below the Si wafer was heated to about 1900° C. by resistance heating, so as to be molten, whereas an iron vapor generated upon the evaporation of iron was supplied into the plasmas along an exhaust flow within the chamber. Further, a heater attached to the support table was energized, so as to heat the Si wafer such that the substrate temperature became 250° C. This deposited amorphous Fe$_x$Si$_y$:H onto the Si wafer, thereby forming an iron silicide film having a thickness of 300 nm in accordance with the present invention. The hydrogen atom content in this iron silicide film was determined from the amount of desorption of the hydrogen gas obtained by the above-mentioned TDS, and was found to be 12.5 atom %.

COMPARATIVE EXAMPLE 1

An Si wafer having a main surface with a surface orientation of (100) was accommodated as a substrate into an upper part of a PVD chamber and fixed to a support table, whereas the chamber was evacuated such that the pressure within the chamber became 1.33 Pa. The heater attached to the support table was energized, so as to heat the Si wafer such that the substrate temperature became 250° C. Further, while keeping this pressure, an Ar gas was supplied into the PVD chamber at a flow rate of 40 sccm, and a high-frequency power of 100 W was applied thereto, so as to generate Ar ions, which were made incident on an iron silicide target disposed so as to oppose the Si wafer within the chamber. This deposited sputtering particles of iron silicide onto the Si wafer, thereby forming an iron silicide film having a thickness of 300 nm.

Figure 4:
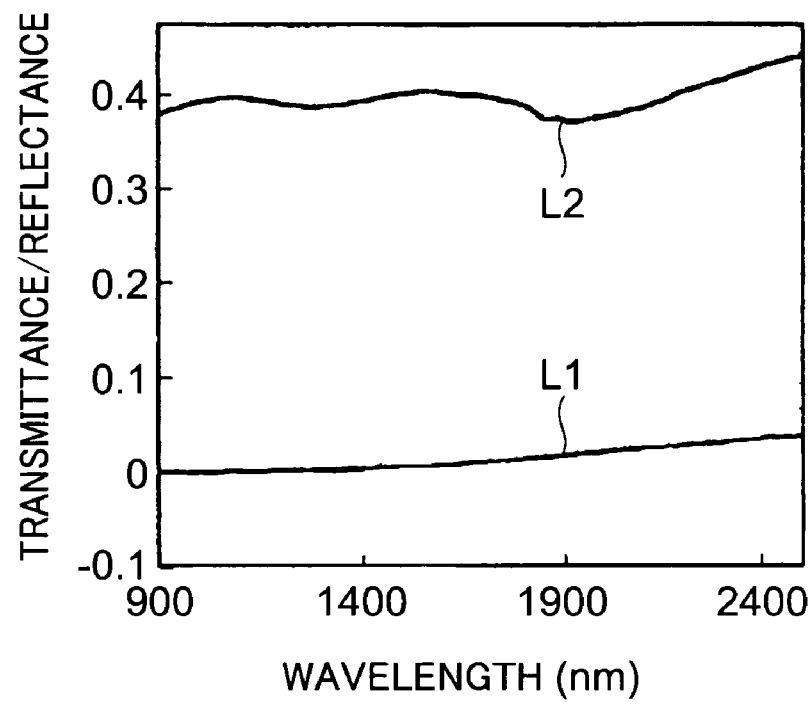
FIG. 4 is a graph showing spectra of transmittance and reflectance of the iron silicide film obtained by Example 1.
Figure 5:
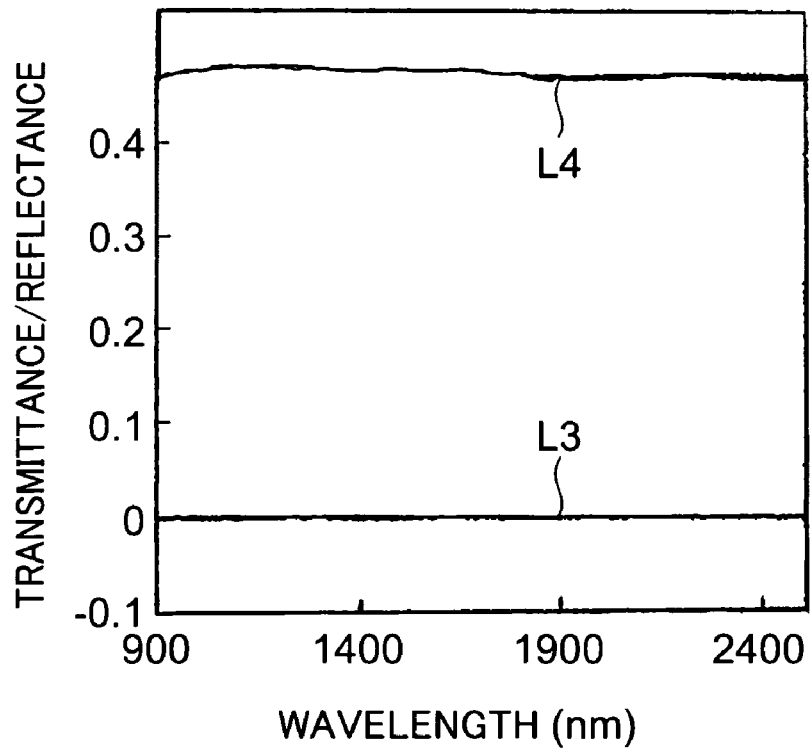
FIG. 5 is a graph showing spectra of transmittance and reflectance of the iron silicide film obtained by Comparative Example 1.

Physical Property Evaluation of Iron Silicide Film (1) Using u-4000 (product name) manufactured by Hitachi, Ltd., the transmittance and reflectance of each of the iron silicide films obtained by Example 1 and Comparative Example 1 were measured. FIGS. 4 and 5 are graphs showing spectra of transmittance and reflectance in the respective iron silicide films obtained by Example 1 and Comparative Example 1. In these graphs, curves L1, L3 show transmittance spectra, whereas curves L2, L4 show reflectance spectra. These results verified that each of the iron silicide films of Example 1 and Comparative Example 1 exhibited a reflection characteristic at least with respect to light having a wavelength of 900 to 2400 nm. It was also seen that, while the iron silicide film exhibited a transmission characteristic with respect to light having a wavelength of about 1500 nm or longer, the iron silicide film of Comparative Example 1 showed no transmission characteristic with respect to light in the represented wavelength region.

Figure 6:
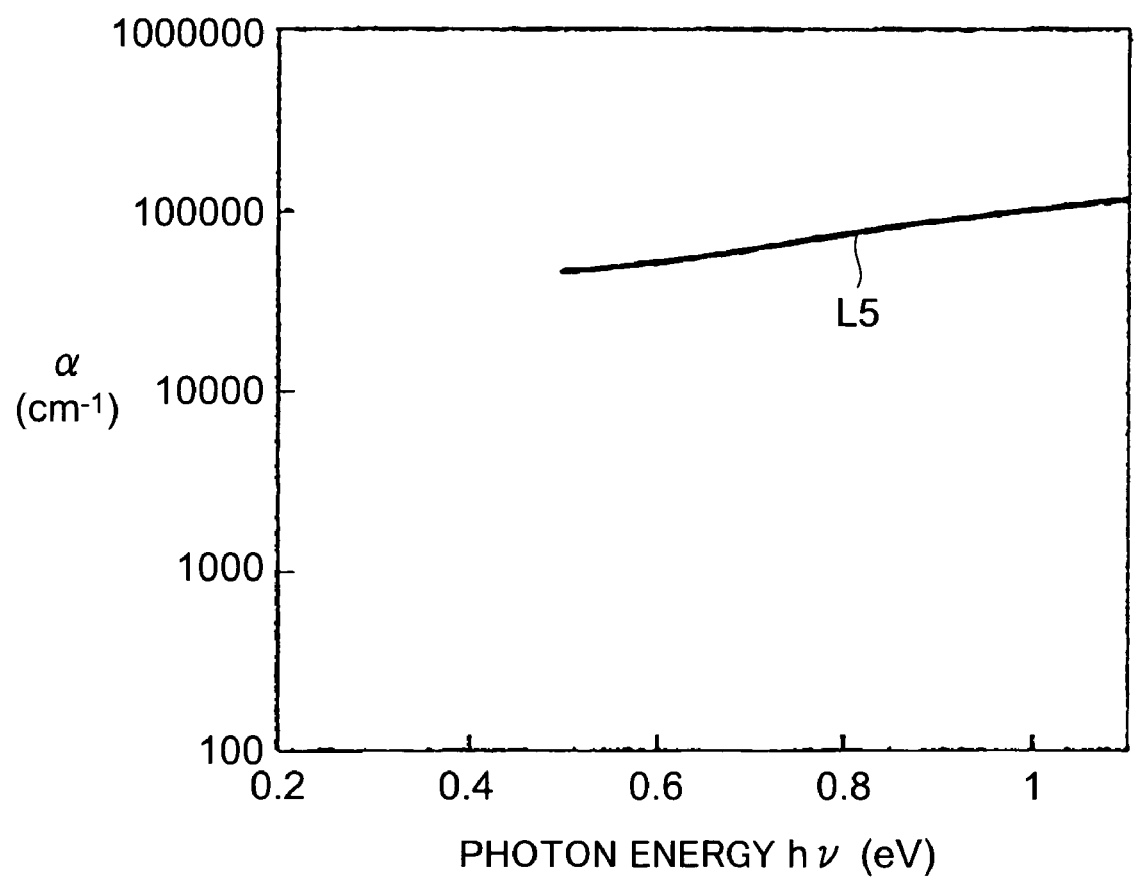
FIG. 6 is a graph showing the change in absorption coefficient $\alpha$ with respect to photon energy hv in the iron silicide film obtained by Example 1.
Figure 7:
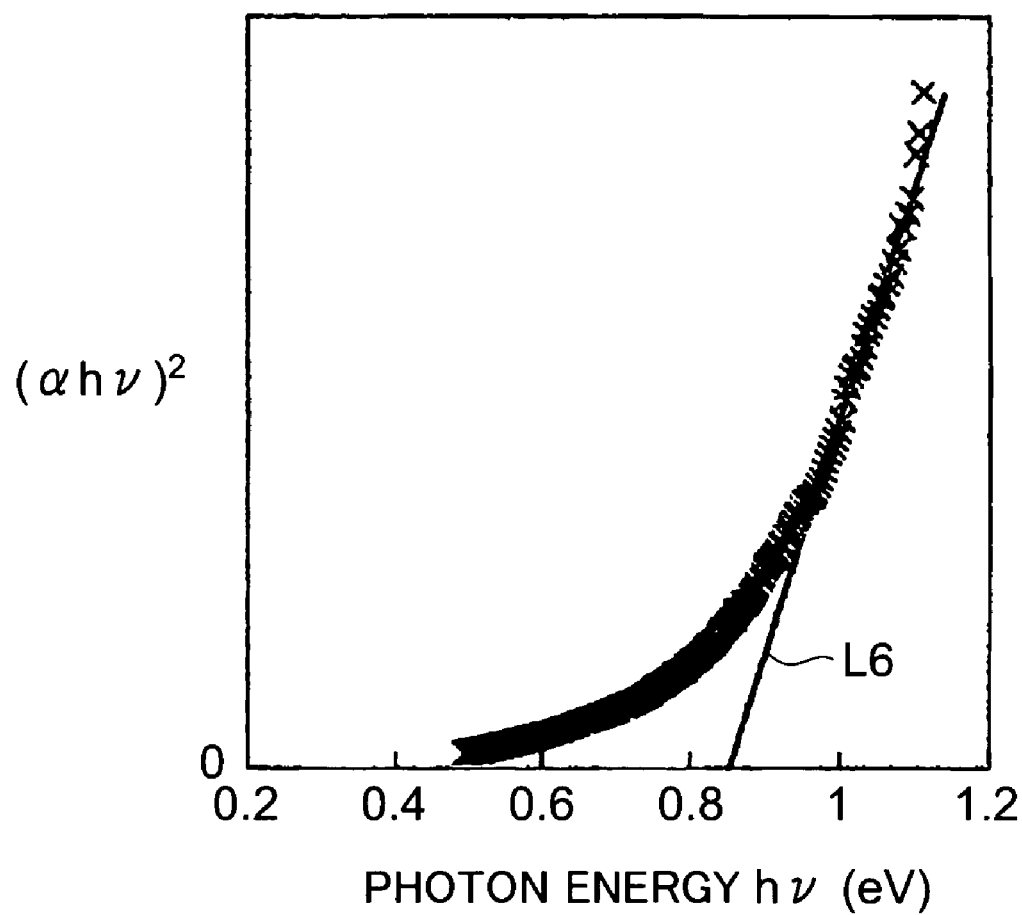
FIG. 7 is a graph showing the change in $(\alpha h v)^2$ value with respect to photon energy hv in the iron silicide film obtained by Example 1.

(2) Using the transmittance and reflectance spectra of the iron silicide film of Example 1 obtained by the above-mentioned (1), the absorption coefficient $\alpha$ per photon energy hv (where h is the Planck constant, and v is the frequency). FIG. 6 is a graph showing the change in absorption coefficient $\alpha$ with respect to the photon energy hv in the iron silicide film obtained by Example 1. Curve L5 in the graph is an index line connecting smoothened plot data. Using thus obtained absorption coefficient $\alpha$ and photon energy hv, the $(\alpha h v)^2$ value was calculated. FIG. 7 is a graph showing the change in $(\alpha h v)^2$ value with respect to the photon energy hv in the iron silicide film obtained by Example 1. Line L6 in the graph is an index line obtained by connecting and extrapolating plot data (x) at photon energy hv≈0.9 to 1.1 eV.

FIG. 7 elucidated that the iron silicide film obtained by Example 1 exhibited a semiconductor optical characteristic having an optical bandgap Eg(opt) of about 0.85 eV (the abscissa intercept of line L6 in FIG. 7). The Eg value matches the tendency of transmission spectrum indicated by curve L1 in FIG. 4. Since the iron silicide film formed at a substrate temperature of 250° C. thus has a semiconductor characteristic, it is understood that i-layers in pin junctions in the photoelectric transducer and apparatus in accordance with the present invention can be formed by heat treatment at a very low temperature.

EXAMPLE 2

First, on a glass substrate (substrate 11) having a main surface with a surface orientation of (100), a metal electrode layer 12 made of Ti having a thickness of 0.3 μm was formed by sputtering. Subsequently, an n-layer 13 made of an n-type silicon having a thickness of 30 nm was formed thereon by plasma CVD, and then an i-layer 14 made of an iron silicide film having a thickness of 400 nm was formed thereon as in Example 1. Thereafter, a p-layer made of p-type silicon having a thickness of 20 nm was formed thereon by plasma CVD, thus constructing a pin junction 100. Further, a transparent electrode layer 16 made of ITO having a thickness of 80 nm was formed, so as to manufacture a photoelectric transducer apparatus in accordance with the present invention having the same configuration as with the solar battery 10 shown in FIG. 1.

EXAMPLE 3

A photoelectric transducer apparatus in accordance with the present invention having the same configuration as with the hybrid solar battery 20 shown in FIG. 2 was manufactured as in Example 2 except that, after forming the i-layer 14 (corresponding to the i-layer 241), an i-layer 242 made of amorphous silicon having a thickness of 200 nm was formed by plasma CVD (under the film forming condition with an SiH4 flow rate of 20 sccm, an H$_2$ flow rate of 200 sccm, an in-chamber pressure of 133 Pa, a high-frequency power of 60 W, and a substrate temperature of 200° C.), and then a p-layer 15 was formed on the i-layer 242, so as to construct a pin junction 200.

EXAMPLE 4

A photoelectric transducer apparatus in accordance with the present invention having the same configuration as with the tandem solar battery 30 shown in FIG. 3 was manufactured as in Example 2 except that, after the pin junction 100 was constructed, an n-layer 33 similar to the n-layer 13 was formed on the p-layer 15, an i-layer 34 similar to the i-layer 242 was formed thereon, and then a p-layer 35 similar to the p-layer 15 was formed thereon, so as to construct a pin junction 300.

COMPARATIVE EXAMPLE 2

A photoelectric transducer apparatus was manufactured as in Example 2 except that an i-layer made of an iron silicide film having a thickness of 400 nm was formed in place of the i-layer 14 as in Comparative Example 1.

Physical Property Evaluation of Photoelectric Transducer Apparatus

Using a solar simulator (product name: WXS-110-S) manufactured by Wacom Electric Co., Ltd., the I-V characteristic in each of the photoelectric transducer apparatus (monitor cells of 1 cm×1 cm) obtained by Examples 2 to 4 and Comparative Example 2 upon irradiation with light with an AM of 1.5 and an intensity condition of 100 mW/cm$^2$ was measured. The following shows the results.

(1) The Photoelectric Transducer Apparatus of Example 2

A curve indicating an I-V characteristic (diode characteristic) inherent in semiconductors was obtained.

Jsc: 13.4 (mA/cm$^2$)
Voc: 0.45 (V)
F.F.: 0.60 (−)
conversion efficiency: 3.6(%)

(2) The Photoelectric Transducer Apparatus of Example 3

A curve indicating an I-V characteristic (diode characteristic) inherent in semiconductors was obtained.

Jsc: 18.0 (mA/cm$^2$)
Voc: 0.42 (V)
F.F.: 0.56 (−)
conversion efficiency: 4.2(%)

(3) The Photoelectric Transducer Apparatus of Example 4

A curve indicating an I-V characteristic (diode characteristic) inherent in semiconductors was obtained.

Jsc: 16.2 (mA/cm$^2$)
Voc: 1.27 (V)
F.F.: 0.50 (−)
conversion efficiency: 10.3(%)

(4) The Photoelectric Transducer Apparatus of Comparative Example 2

* A curve indicating an I-V characteristic (diode characteristic) inherent in semiconductors was not obtained. Namely, an I-V characteristic represented by a substantially straight line in an I-V plane was obtained. Though Jsc, Voc, F.F., and conversion efficiency thus could not be evaluated, simulated characteristic values were tried to be evaluated from the intercept values of the above-mentioned straight line in the I-V plane coordinates. These results are shown in the following for reference:

Jsc (reference): 3.11 (mA/cm$^2$)
Voc (reference): 0.15 (V)
F.F. (reference): 0.25 (−)
conversion efficiency (reference): 0.11(%)

INDUSTRIAL APPLICABILITY

The photoelectric transducer, photoelectric transducer apparatus, and iron silicide film of the present invention can be utilized in solar batteries.

The invention claimed is:

1. A photoelectric transducer comprising a first pin junction part including:
a first p-layer;
a first n-layer disposed so as to oppose the first p-layer; and
a first i-layer, disposed between the first p-layer and first n-layer, containing an iron atom, a silicon atom bonded to the iron atom, and a hydrogen atom,
wherein a composition ratio between the iron atom and the silicon atom in the first i-layer is in a range from 1:1.7 to 1:3.5, and
wherein the first i-layer is formed by at least partly bonding the hydrogen atom to the silicon atom and the iron atom.

2. A photoelectric transducer according to claim 1, wherein the first i-layer is mainly amorphous.

3. A photoelectric transducer according to claim 2, wherein the first i-layer has a hydrogen atom content of 1 to 25 atom %.

4. A photoelectric transducer according to claim 2, wherein the first pin junction part further comprises a second i-layer disposed between the first p-layer and first n-layer and constituted by a mainly amorphous silicon film.

5. A photoelectric transducer according to claim 2, further comprising a second pin junction part, disposed in series with the first pin junction part, including:
a second p-layer;
a second n-layer disposed so as to oppose the second p-layer; and
a third i-layer disposed between the second p-layer and second n-layer and made of an amorphous silicon film.

6. A photoelectric transducer according to claim 1, wherein the first i-layer has a hydrogen atom content of 1 to 25 atom %.

7. A photoelectric transducer according to claim 6, wherein the first pin junction part further comprises a second i-layer disposed between the first p-layer and first n-layer and constituted by a mainly amorphous silicon film.

8. A photoelectric transducer according to claim 6, further comprising a second pin junction part, disposed in series with the first pin junction part, including:
a second p-layer;
a second n-layer disposed so as to oppose the second p-layer; and
a third i-layer disposed between the second p-layer and second n-layer and made of an amorphous silicon film.

9. A photoelectric transducer according to claim 1, wherein the first pin junction part further comprises a second i-layer disposed between the first p-layer and first n-layer and constituted by a mainly amorphous silicon film.

10. A photoelectric transducer according to claim 1, further comprising a second pin junction part, disposed in series with the first pin junction part, including:
a second p-layer;
a second n-layer disposed so as to oppose the second p-layer; and
a third i-layer disposed between the second p-layer and second n-layer and made of an amorphous silicon film.

11. A photoelectric transducer according to claim 1, wherein the composition ratio between the iron atom and silicon atom in the first i-layer is substantially 1:2.

12. A photoelectric transducer apparatus comprising:
a substrate;
a first electrode layer disposed on one side of the substrate;
a second electrode layer disposed so as to oppose the first electrode layer; and
a first pin junction part including a first n-layer formed on the first electrode layer, a first p-layer formed on one side of the second electrode layer so as to oppose the first n-layer, and a first i-layer, disposed between the first p-layer and first n-layer, containing an iron atom, a silicon atom bonded to the iron atom, and a hydrogen atom,
wherein a composition ratio between the iron atom and the silicon atom in the first i-layer is in a range from 1:1.7 to 1:3.5, and wherein the first i-layer is formed by at least partly bonding the hydrogen atom to the silicon atom and the iron atom.

13. A photoelectric transducer according to claim 12, wherein the composition ratio between the iron atom and silicon atom in the first i-layer is substantially 1:2.

14. An iron silicide film for constructing an i-layer in a pin junction;

the iron silicide film containing an iron atom, a silicon atom bonded to the iron atom, and a hydrogen atom while being mainly amorphous, wherein a composition ratio between the iron atom and the silicon atom is in a range from 1:1.7 to 1:3.5, and wherein the first i-layer is formed by at least partly bonding the hydrogen atom to the silicon atom and the iron atom.

15. An iron silicide film according to claim 14, wherein the composition ratio between the iron atom and silicon atom in the first i-layer is substantially 1:2.

* * * * *